(12) United States Patent
Zeng et al.

(10) Patent No.: US 10,725,570 B2
(45) Date of Patent: Jul. 28, 2020

(54) INTEGRATED CIRCUIT PIN, IN-CELL TOUCH PANEL, AND METHOD OF ENCAPSULATING INTEGRATED CIRCUIT PIN

(71) Applicant: Wuhan China Star Optoelectronics Technology Co., Ltd., Wuhan, Hubei (CN)

(72) Inventors: Shuanghua Zeng, Hubei (CN); Zhihao Cao, Hubei (CN)

(73) Assignee: WUHAN CHINA STAR OPTOELECTRONICS TECHNOLOGY CO., LTD., Wuha (CN)

( * ) Notice: Subject to any disclaimer, the term of this patent is extended or adjusted under 35 U.S.C. 154(b) by 332 days.

(21) Appl. No.: 15/735,785

(22) PCT Filed: Oct. 19, 2017

(86) PCT No.: PCT/CN2017/106834
§ 371 (c)(1),
(2) Date: Dec. 12, 2017

(87) PCT Pub. No.: WO2019/061589
PCT Pub. Date: Apr. 4, 2019

(65) Prior Publication Data
US 2020/0033973 A1 Jan. 30, 2020

(30) Foreign Application Priority Data
Sep. 29, 2017 (CN) .......................... 2017 1 0909801

(51) Int. Cl.
*G02F 1/1362* (2006.01)
*G06F 3/041* (2006.01)
(Continued)

(52) U.S. Cl.
CPC ............ *G06F 3/0412* (2013.01); *H01L 21/56* (2013.01); *H01L 21/76802* (2013.01); *H01L 21/76877* (2013.01); *H01L 23/50* (2013.01)

(58) Field of Classification Search
None
See application file for complete search history.

(56) References Cited

U.S. PATENT DOCUMENTS

| 9,158,419 B2* | 10/2015 | Kim ........................ G06F 3/044 |
| 2014/0131719 A1* | 5/2014 | Nishino .............. G02F 1/13458 257/72 |

* cited by examiner

*Primary Examiner* — Carl Adams
(74) *Attorney, Agent, or Firm* — Hemisphere Law, PLLC; Zhigang Ma

(57) ABSTRACT

An integrated circuit pin is provided. The integrated circuit pin includes a glass substrate, a buffer layer above the glass substrate, a gate insulating layer above the buffer layer, a first metal layer above the gate insulating layer, a second metal layer above the first metal layer, a first insulating layer above the second metal layer, a second insulating layer above the first insulating layer, a bottom indium tin oxide (BITO) above the second insulating layer, and a top indium tin oxide covering the BITO. The BITO further extends downwardly along the inner wall of a through-hole penetrating through the first and second insulating layers such that the BITO is connected to the second metal layer. An in-cell touch panel is also provided. According to the disclosure, the thickness of the conductive layer can be increased. The anti-external interference and the drop reliability of ITP products can be enhanced.

4 Claims, 2 Drawing Sheets

(51) Int. Cl.
*H01L 21/56* (2006.01)
*H01L 21/768* (2006.01)
*H01L 23/50* (2006.01)

INTEGRATED CIRCUIT PIN, IN-CELL TOUCH PANEL, AND METHOD OF ENCAPSULATING INTEGRATED CIRCUIT PIN

RELATED APPLICATIONS

The present application is a National Phase of International Application Number PCT/CN2017/106834, filed on Oct. 19, 2017, and claims the priority of China Application No. 201710909801.3, filed on Sep. 29, 2017, and entitled "INTEGRATED CIRCUIT PIN, IN-CELL TOUCH PANEL, AND METHOD OF ENCAPSULATING INTEGRATED CIRCUIT PIN", the entirety of which is incorporated by reference herein.

FIELD OF THE DISCLOSURE

The disclosure relates to a semiconductor technical field, and more particularly to an integrated circuit pin, an in-cell touch panel, and a method of encapsulating an integrated circuit pin.

BACKGROUND

In-Cell Touch Panel (ITP) integrates touch function on the liquid crystal display substrate. The touch function is achieved through the change of touch induction capacitance. It has various advantages such as lower cost, thinner, lighter and more convenient application.

However, as shown in FIG. 1, the fabrication of integrated circuit pins of the current ITP products comprises etching away all the bottom indium tin oxide (BITO), The top indium tin oxide 10/(TITO) is connected to the second metal layer 6/(Metal 2) via the through-holes K. The through-holes K penetrate through the first insulating layer 7/(Insulating Layer 1), the second insulating layer 8/(Insulating Layer 2), and the passivation layer PV. Accordingly, the through-holes K are steep and deep. In the drop test with a range from 1.2 m to 1.5 m, staffs often find that the touch panel appears a checkerboard discrepancy phenomenon. By using a scanning electron microscope, it can be confirmed that the main reason for the above phenomenon is: the top indium tin oxide 10/at the through-holes K is too steep and too thin. The loss and break of the top indium tin oxide 10/would be easily induced by the external force.

SUMMARY

A technical problem to be solved by embodiments of the disclosure is to provide an integrated circuit pin, an in-cell touch panel, and a method of encapsulating an integrated circuit pin. Therefore, the thickness of the conductive layer can be increased. The anti-external interference and the drop reliability of ITP products can be enhanced.

In order to solve the technical problem, embodiments of the disclosure provide an integrated circuit pin. The integrated circuit pin is applied to an integrated circuit (IC) of an in-cell touch panel. The integrated circuit pin comprises:
  a glass substrate;
  a buffer layer disposed above the glass substrate;
  a gate insulating layer disposed above the buffer layer;
  a first metal layer disposed above the gate insulating layer;
  a second metal layer disposed above the first metal layer;
  a first insulating layer disposed above the second metal layer;
  a second insulating layer disposed above the first insulating layer;
  a bottom indium tin oxide disposed above the second insulating layer, wherein the bottom indium tin oxide further extends downwardly along an inner wall of at least one through-hole penetrating through the first insulating layer and the second insulating layer such that the bottom indium tin oxide is connected to the second metal layer;
  a top indium tin oxide covering the bottom indium tin oxide.

Wherein the depth of each through-hole is equal.

Wherein the thickness of the bottom indium tin oxide on the inner wall of each through-hole is equal to the thickness of the bottom indium tin oxide on the bottom of the through-hole, which correspondingly covers the second metal layer.

Correspondingly, embodiments of the disclosure also provide an in-cell touch panel. The in-cell touch panel comprises an integrated circuit pin. The integrated circuit pin is applied to an integrated circuit (IC) of the in-cell touch panel. The integrated circuit pin comprises:
  a glass substrate;
  a buffer layer disposed above the glass substrate;
  a gate insulating layer disposed above the buffer layer;
  a first metal layer disposed above the gate insulating layer;
  a second metal layer disposed above the first metal layer;
  a first insulating layer disposed above the second metal layer;
  a second insulating layer disposed above the first insulating layer;
  a bottom indium tin oxide disposed above the second insulating layer, wherein the bottom indium tin oxide further extends downwardly along an inner wall of at least one through-hole penetrating through the first insulating layer and the second insulating layer such that the bottom indium tin oxide is connected to the second metal layer;
  a top indium tin oxide covering the bottom indium tin oxide.

Wherein the depth of each through-hole is equal.

Wherein the thickness of the bottom indium tin oxide on the inner wall of each through-hole is equal to the thickness of the bottom indium tin oxide on the bottom of the through-hole, which correspondingly covers the second metal layer.

Correspondingly, embodiments of the disclosure further provide a method of encapsulating an integrated circuit pin. The method comprises the following steps:
  providing a glass substrate;
  forming, in order from bottom to top, a buffer layer, a gate insulating layer, a first metal layer, a second metal layer, a first insulating layer and a second insulating layer above the glass substrate;
  selecting a plurality of etching points on the second insulating layer and etching from top to bottom into the first insulating layer such that a plurality of through-holes is formed, wherein the plurality of through-holes penetrates through the upper and lower surfaces of both the second insulating layer and the first insulating layer;
  disposing a bottom indium tin oxide on the second insulating layer and further downwardly extending the bottom indium tin oxide along an inner wall of at least one through-hole such that the bottom indium tin oxide is connected to the second metal layer; and covering the bottom indium tin oxide with a top indium tin oxide thereon.

Wherein the depth of each through-hole is equal.

Wherein the thickness of the bottom indium tin oxide on the inner wall of each through-hole is equal to the thickness of the bottom indium tin oxide on the bottom of the plurality of through-holes, which correspondingly covers the second metal layer.

Wherein the formation of the first insulating layer and the second insulating layer above the glass substrate comprises:
  coating a first insulating layer material on the second metal layer;
  coating a third metal layer on the first insulating layer material;
  etching away the third metal layer;
  coating a second insulating layer material on the first insulating layer material;
  coating a photoresist layer on the second insulating layer material and performing exposure, development, etching, and stripping processes to form the first insulating layer and the second insulating layer, wherein at least one through-hole penetrates through the first insulating layer and the second insulating layer.

Wherein before the coverage of the bottom indium tin oxide with the top indium tin oxide thereon, the method further comprises:
  coating a passivation layer above the bottom indium tin oxide;
  etching away the passivation layer.

Compared with the conventional integrated circuit pins, the disclosure comprises etching the passivation layer PV and adding the bottom indium tin oxide with conductive property. As a result, the conductive layer is thickened. The bottom indium tin oxide is connected to the second metal layer via the through-holes penetrating through the first insulating layer and the second insulating layer. It can reduce the risk of the peeling and loss of the conductive layer, which would be induced by the external force. Therefore, the anti-external interference and the drop reliability of ITP products can be enhanced.

BRIEF DESCRIPTION OF THE DRAWINGS

In order to more clearly illustrate embodiments of the disclosure or technical solutions in the prior art, the accompanying drawings, which are used in the description of the embodiments or the prior art, will be briefly described. Apparently, the accompanying drawings in the description below are merely some embodiments of the disclosure. Other drawings can be obtained by a person skilled in the art according to these drawings without creative efforts and therefore are included in the protection scope of the disclosure.

DETAILED DESCRIPTION OF PREFERRED EMBODIMENTS

The preferred embodiments of the disclosure will be described with reference to accompanying drawings as follows.

Figure 1:
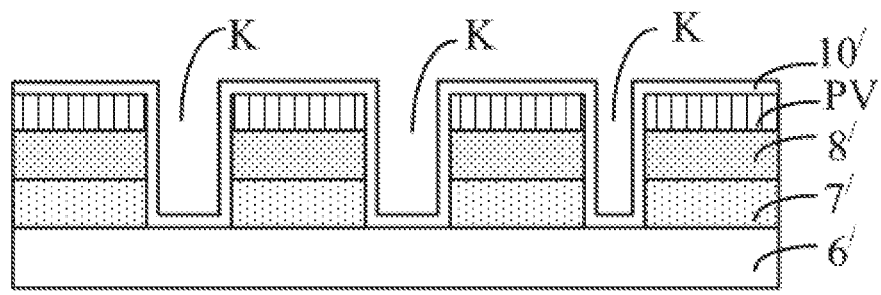
FIG. 1 is a partial cross-sectional view of an integrated circuit pin in the prior art.
Figure 2:
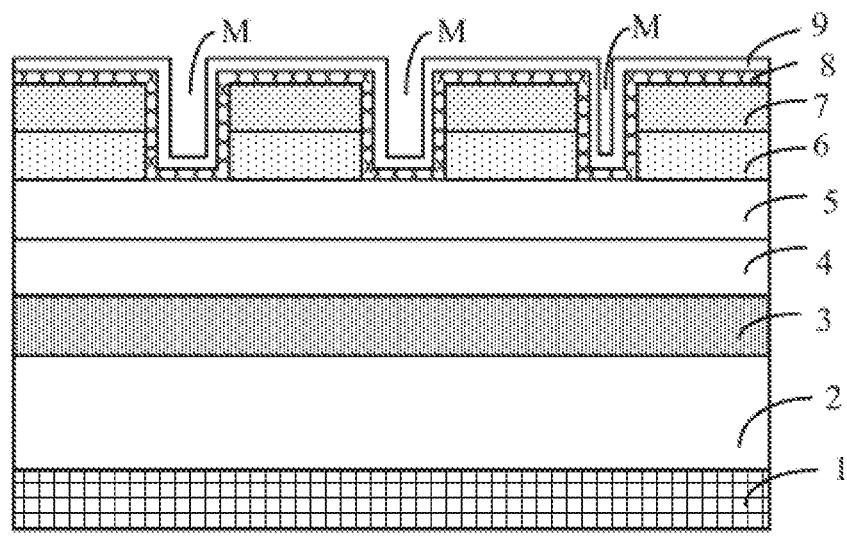
FIG. 2 is a partial cross-sectional view of an integrated circuit pin according to a first embodiment of the disclosure.

As shown in FIG. 2, the first embodiment of the disclosure provides an integrated circuit pin. The integrated circuit pin is applied to an integrated circuit (IC) of an in-cell touch panel. The integrated circuit pin comprises:
  a glass substrate 1;
  a buffer layer 2 disposed above the glass substrate 1;
  a gate insulating layer 3 disposed above the buffer layer 2;
  a first metal layer 4 disposed above the gate insulating layer 3;
  a second metal layer 5 disposed above the first metal layer 4;
  a first insulating layer 6 disposed above the second metal layer 5;
  a second insulating layer 7 disposed above the first insulating layer 6;
  a bottom indium tin oxide 8 disposed above the second insulating layer 7, wherein the bottom indium tin oxide 8 further extends downwardly along an inner wall of at least one through-hole M penetrating through the first insulating layer 6 and the second insulating layer 7 such that the bottom indium tin oxide is connected to the second metal layer 5;
  a top indium tin oxide 9 covering the bottom indium tin oxide 8.

It can be understood that the through-hole M of the integrated circuit pin of the first embodiment of the disclosure penetrates through only the first insulating layer 6 and the second insulating layer 7 without penetrating through the passivation layer PV in the conventional integrated circuit pin. As a result, the depth of the through-hole M can be reduced. The slope of the through-hole M can be modified to be lower. At the same time, the bottom indium tin oxide with conductive property is added, thereby thickening the conductive layer. The risk of the peeling and loss of the conductive layer, which would be induced by the external force, can also be reduced.

Since both the first insulating layer 6 and the second insulating layer 7 are layers with a uniform thickness, the depth of each through-hole M after etching is equal.

The thickness of the bottom indium tin oxide 8 on the inner wall of each through-hole M is equal to the thickness of the bottom indium tin oxide 8 on the bottom of the through-hole M, which correspondingly covers the second metal layer 5. Therefore, the conductive uniformity between the bottom indium tin oxide 8 and the second metal layer 5 can be improved.

Corresponding to an integrated circuit pin in the first embodiment of the disclosure, the second embodiment of the disclosure also provides an in-cell touch panel. The in-cell touch panel comprises the integrated circuit pin in the first embodiment of the disclosure. Since the integrated circuit pin in the second embodiment of the disclosure has the same structure and connection relationship as those of the integrated circuit pin in the first embodiment of the disclosure, the description is not repeated again.

Figure 3:
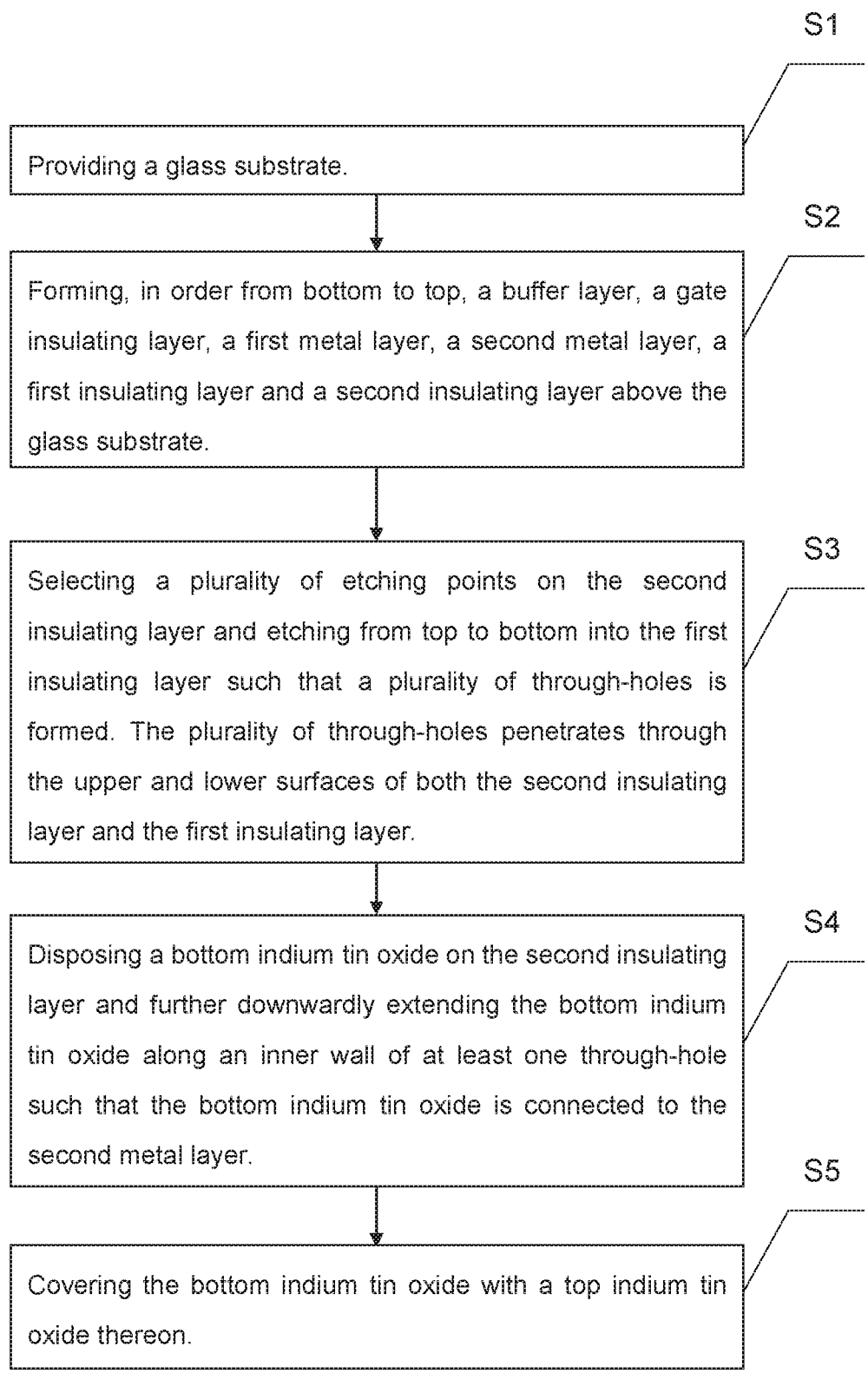
FIG. 3 is a flow chart of a method of encapsulating an integrated circuit pin according to a third embodiment of the disclosure.

As shown in FIG. 3, corresponding to an integrated circuit pin in the first embodiment of the disclosure, the third embodiment of the disclosure further provides a method of encapsulating an integrated circuit pin. The method comprises the following steps:

Step S1: Providing a glass substrate.

The glass substrate comprises a display region and a non-display region, wherein integrated circuit pins are fabricated in the non-display region.

Step S2: Forming, in order from bottom to top, a buffer layer, a gate insulating layer, a first metal layer, a second metal layer, a first insulating layer and a second insulating layer above the glass substrate.

In one embodiment, a light shading layer (LS) is first formed on the glass substrate before the formation of the buffer layer. The specific process comprises: depositing a light shading material on the glass substrate by a physical vapor deposition (PVD) process. A photoresist layer is then coated on the light shading material. Afterwards, exposure, development, etching and stripping processes are performed to obtain the light shading layer.

In one embodiment, after the formation of the buffer layer, a polysilicon layer is formed. A gate insulating layer is then formed. The specific process of the polysilicon layer comprises: depositing an amorphous silicon material by a chemical vapor deposition (CVD) process. An excimer laser annealing (ELA) process is performed to make the amorphous silicon material be crystallized. A photoresist layer is then coated, and exposure, development, etching and stripping processes are performed to obtain the pattern of a light shielding layer. Afterwards, channel doping (NOD) and negative doping (NP) processes are performed on the pattern of the light shielding layer to obtain the polysilicon layer.

In one embodiment, the formation of the first insulating layer and the second insulating layer above the glass substrate comprises the following steps:

S21: Coating a first insulating layer material on the second metal layer. Optionally, the first insulating layer material can be coated in the display region and the non-display region of the glass substrate.

S22: Coating a third metal layer on the first insulating layer material.

S23: Etching away the third metal layer.

S24: Coating a second insulating layer material on the first insulating layer material.

S25: Coating a photoresist layer on the second insulating layer material and performing exposure, development, etching, and stripping processes to form the first insulating layer and the second insulating layer. At least one through-hole penetrates through the first insulating layer and the second insulating layer.

Step S3: Selecting a plurality of etching points on the second insulating layer and etching from top to bottom into the first insulating layer such that a plurality of through-holes is formed. The plurality of through-holes penetrates through the upper and lower surfaces of both the second insulating layer and the first insulating layer.

In the step S3, a photoresist layer is coated on the second insulating layer by a photolithography process. Afterwards, the plurality of through-holes penetrating through the second insulating layer and the first insulating layer is formed by performing exposure, development, etching and stripping processes.

Step S4: Disposing a bottom indium tin oxide on the second insulating layer and further downwardly extending the bottom indium tin oxide along an inner wall of at least one through-hole such that the bottom indium tin oxide is connected to the second metal layer.

Step S5: Covering the bottom indium tin oxide with a top indium tin oxide thereon.

Wherein the depth of each of the through-holes is equal.

Wherein the thickness of the bottom indium tin oxide on the inner wall of each of the through-holes is equal to the thickness of the bottom indium tin oxide on the bottom of the through-holes, which correspondingly covers the second metal layer.

Wherein before the coverage of the bottom indium tin oxide with the top indium tin oxide thereon, the method further comprises:

Coating a passivation layer above the bottom indium tin oxide. Etching away the passivation layer.

Specifically, the passivation layer in the non-display region is etched away, while the passivation layer in the display region is left.

In summary, compared with the conventional integrated circuit pins, the disclosure comprises etching the passivation layer PV and adding the bottom indium tin oxide with conductive property. As a result, the conductive layer is thickened. The bottom indium tin oxide is connected to the second metal layer via the through-holes penetrating through the first insulating layer and the second insulating layer. It can reduce the risk of the peeling and loss of the conductive layer, which would be induced by the external force. Therefore, the anti-external interference and the drop reliability of the ITP products can be enhanced.

It will be understood by those of ordinary skill in the art that all or part of the steps in the described embodiments can be realized and accomplished by using program to instruct related hardware. The program may be stored in a computer-readable memory medium. The medium may be, such as, ROM/RAM, disk, compact disc, and so on.

The foregoing descriptions are merely preferred embodiments of the disclosure. The protection scope of the disclosure is not limited to these descriptions. Therefore, equivalent changes made according to the disclosure should be included in the protection scope of the application.

What is claimed is:

1. A method of encapsulating an integrated circuit pin, comprising:
   providing a glass substrate;
   forming, in order from bottom to top, a buffer layer, a gate insulating layer, a first metal layer, a second metal layer, a first insulating layer and a second insulating layer above the glass substrate;
   selecting a plurality of etching points on the second insulating layer and etching from top to bottom into the first insulating layer such that a plurality of through-holes is formed, wherein the plurality of through-holes penetrates through upper and lower surfaces of both the second insulating layer and the first insulating layer;
   disposing a bottom indium tin oxide on the second insulating layer and further downwardly extending the bottom indium tin oxide along an inner wall of at least one of the plurality of through-holes such that the bottom indium tin oxide is connected to the second metal layer; and
   covering the bottom indium tin oxide with a top indium tin oxide thereon;
   wherein the formation of the first insulating layer and the second insulating layer above the glass substrate comprises:
     coating a first insulating layer material on the second metal layer;
     coating a third metal layer on the first insulating layer material;
     etching away the third metal layer;
     coating a second insulating layer material on the first insulating layer material; and
     coating a photoresist layer on the second insulating layer material and performing exposure, development, etching, and stripping processes to form the first insulating layer and the second insulating layer, wherein at least one of the plurality of through-holes penetrates through the first insulating layer and the second insulating layer.

2. The method of encapsulating an integrated circuit pin as claimed in claim 1, wherein a depth of each of the plurality of through-holes is equal.

3. The method of encapsulating an integrated circuit pin as claimed in claim 2, wherein a thickness of the bottom indium tin oxide on the inner wall of each of the plurality of through-holes is equal to a thickness of the bottom indium tin oxide on a bottom of the plurality of through-holes, which correspondingly covers the second metal layer.

4. The method of encapsulating an integrated circuit pin as claimed in claim 1, wherein before the coverage of the bottom indium tin oxide with the top indium tin oxide thereon, the method further comprises:

coating a passivation layer above the bottom indium tin oxide; and etching away the passivation layer.

* * * * *